United States Patent
Kronfeld

(10) Patent No.: US 7,983,378 B2
(45) Date of Patent: Jul. 19, 2011

(54) EXTENDED MULTI-MODULUS PRESCALER

(75) Inventor: Ronen Kronfeld, Shoham (IL)

(73) Assignee: Intel Corporation, Santa Clara, CA (US)

( * ) Notice: Subject to any disclaimer, the term of this patent is extended or adjusted under 35 U.S.C. 154(b) by 308 days.

(21) Appl. No.: 12/165,453

(22) Filed: Jun. 30, 2008

(65) Prior Publication Data

US 2009/0322438 A1 Dec. 31, 2009

(51) Int. Cl.
*H03K 9/06* (2006.01)
*H03D 3/00* (2006.01)
*G01R 23/02* (2006.01)

(52) U.S. Cl. .......... 377/47; 327/115; 327/117; 327/158; 332/117; 377/48

(58) Field of Classification Search .......... 327/115, 327/117, 158; 377/47, 48; 332/117
See application file for complete search history.

(56) References Cited

U.S. PATENT DOCUMENTS

| | | | |
|---|---|---|---|
| 6,600,378 B1 * | 7/2003 | Patana | 331/1 A |
| 6,668,035 B2 * | 12/2003 | Han et al. | 377/48 |
| 6,707,855 B2 | 3/2004 | Patana | |
| 7,616,068 B2 * | 11/2009 | Anand | 331/17 |
| 2002/0145472 A1 * | 10/2002 | Oh | 331/1 A |
| 2004/0085103 A1 * | 5/2004 | Ahn et al. | 327/156 |
| 2008/0303566 A1 * | 12/2008 | Shen et al. | 327/157 |

* cited by examiner

*Primary Examiner* — Arnold Kinkead
*Assistant Examiner* — Richard Tan
(74) *Attorney, Agent, or Firm* — Schwabe, Williamson & Wyatt, P.C.

(57) ABSTRACT

Embodiments of apparatuses, articles, methods, and systems for a synthesizer with an extended multi-modulus prescaler are generally described herein. Described embodiments include an offset controller that provides an offset to a first counter value and a multi-modulus prescaler to implement a first modulated division number based on the first counter value and a second counter value. The offset controller may compensate for the offset to provide a second modulated division number based on the first modulated division number. Other embodiments may be described and claimed.

23 Claims, 6 Drawing Sheets

EXTENDED MULTI-MODULUS PRESCALER

FIELD

Embodiments of the present invention relate generally to the field of radio frequency (RF) transceivers, and more particularly, to a synthesizer having an extended multi-modulus prescaler.

BACKGROUND

Fractional-N synthesizers are a common practice in modern radio frequency (RF) transceivers desiring fine frequency resolution with high phase noise performance, typical to broadband or high data-rate applications. While a fractional-N synthesizer may operate at high frequency for a given channel spacing, it may also suffer from any non-linear effects that exist within elements of the synthesizer. This may eventually cause noise folding of the high-pass shaped noise of a delta-sigma modulator (DSM) employed in a feedback loop of the synthesizer. This noise folding may, in turn, cause a noise floor to increase and the integrated phase noise of the synthesizer to degrade.

Non-linear delay variation of a multi-modulus divider of the feedback loop may contribute to non-linearity and noise folding characteristics of these fractional-N synthesizers. One known approach for mitigating such delay variation is by re-sampling the divider output using a voltage controlled oscillator (VCO) frequency. However, this may be difficult to implement, especially at high VCO frequency, and may increase the synthesizer power-consumption.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

As used herein, reference to an "element" may refer to a hardware, a software, and/or a firmware element employed to obtain a desired outcome. Although only a given number of discrete elements may be illustrated and/or described, such elements may nonetheless be represented by additional elements or fewer elements without departing from the spirit and scope of embodiments of this disclosure.

Figure 1:
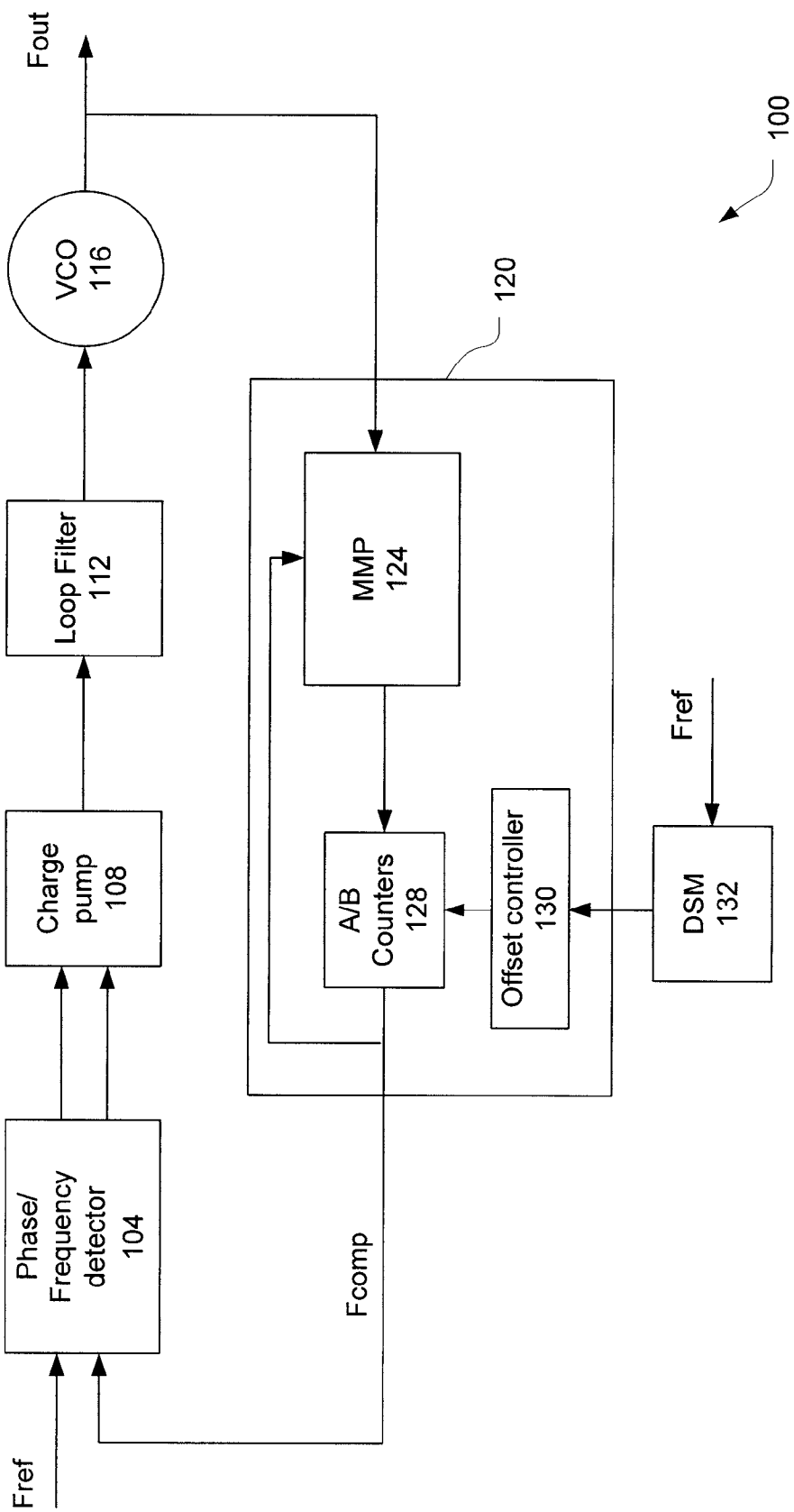
FIG. 1 illustrates a synthesizer in accordance with various embodiments.

FIG. 1 illustrates a fractional-N synthesizer (hereinafter "synthesizer") 100 in accordance with various embodiments. The synthesizer 100 may include a phase/frequency detector 104, a charge pump 108, a loop filter 112, and a voltage controlled oscillator (VCO) 116 coupled to each other at least as shown.

The phase/frequency detector 104 may receive, as inputs, a reference signal (Fref) and a feedback signal (Fcomp). The phase/frequency detector 104 may generate a control signal for the charge pump 108 based at least in part on the phase difference between the two inputs. The control signal may be provided to the charge pump 108 along two input lines to indicate whether the reference signal Fref leads or lags the feedback signal Fcomp.

The charge pump 108 may apply a charge indicative of the phase difference to the loop filter 112. Application of the charge may result in a control voltage applied to the VCO 116. The VCO 116 may then generate a periodic output signal Fout based at least in part on the applied control voltage.

The synthesizer 100 may include a feedback loop to provide a negative feedback system to hold the phase difference between the two inputs to the phase/frequency detector 104 substantially constant. Essentially, if the phase of Fcomp leads Fref, the VCO 116 may be controlled to slow down Fout. Conversely, if the phase of Fcomp lags Fref, the VCO 116 may be controlled to speed up the Fout.

The feedback loop may include a divider 120 to divide the output signal Fout by a non-integer divider, which may be obtained by averaging a series of integer division numbers as explained below. The divider 120 may include a multi-modulus prescaler (MMP) 124, A/B counters 128, and an offset controller 130 coupled with each other at least as shown.

As used herein, "multi-modulus" means having more than one modulus. For example, as will be generally discussed in this disclosure, the MMP 124 may be a dual-modulus prescaler (DMP) having a P modulus and a P+1 modulus (hereinafter "P/P+1 DMP"). In these embodiments, the MMP 124 may divide Fout by P a first number of times and divide Fout by P+1 for a second number of times in order to implement a particular division number N. The first and second number of times may be controlled by the values in the A/B counters 128, which may be, but are not limited to, complementary metal oxide semiconductor (CMOS) counters.

In some embodiments, in order to implement a division number N, the MMP 124 may divide the Fout by P+1 for A division cycles and by P for (B−A) division cycles such that:

$$N = A*(P+1) + (B-A)*P = B*P + A;$$    Equation 1 where $0 \leq A \leq P-1$ and $A \leq B$.

Increasing A by 1 would typically increase N by 1. However, as A overflows, e.g., it reaches P, N may be further increased by increasing B by 1 and setting A back to zero.

During operation, a DSM 132 may modulate the division number N to implement a sequence of modulated division numbers No+D1, No+D2, etc., where No is the set operating point and Di is a cyclic output sequence. The DSM 132 may produce the cyclic output sequence by pseudo-randomly selecting one or more modulation numbers from a range of numbers that includes both positive and negative numbers. For example, if the DSM 132 is a third order MASH modulator (MASH 1-1-1 DSM), the output sequence Di may be selected from a range of numbers $\{-3, -2, -1, 0, 1, 2, 3, 4\}$. This may result in the synthesizer 100 locking to an average frequency that corresponds to a non-integer average division number No+F, where F is the average fraction resulting from the cyclic output sequence, D1, D2, etc., averaged over a complete modulation cycle of the DSM 132.

At the point in the sequence in which the modulated division number is changed, e.g., between No+D1 and No+D2, etc., it may be desirable for any variation in delay provided by the divider 120 to vary in a linear manner in order to avoid the aforementioned non-linear effects in the synthesizer loop. However, as described below, prior art synthesizers utilizing MMP-based dividers may have difficulty in maintaining linearity in delay error variation due to different delay error values associated with each of the moduluses.

The delay variation error of a P/P+1 DMP-based divider may be modeled by assigning a delay error DEL1 to the P modulus and a different delay error DEL2 to the P+1 modulus. The overall input-to-output delay of the divider may then be $$\text{Delay} = A*[(P+1)/F\text{out} + DEL2] + (B-A)[P/F\text{out} + DEL1].$$    Equation 2

Subtracting it from an ideal delay, e.g., N/Fout, results in the delay error being provided for by:

$$\text{Delay err} = A*DEL2 + (B-A)*DEL1.$$    Equation 3

The delay error variation, which may be linear while A is held constant, may become non-linear at the point when A underflows/overflows and B is changed. This may be demonstrated by an example provided by table 1, below, with P=8.

TABLE 1

| A | B | N | Delay Error |
|---|---|---|---|
| 5 | 8 | 5 *9 + 3 * 8 = 69 | 5 * DEL2 + 3 * DEL1 |
| 6 | 8 | 6 *9 + 2 * 8 = 70 | 6 * DEL2 + 2 * DEL1 |
| 7 | 8 | 7 *9 + 1 * 8 = 71 | 7 * DEL2 + 1 * DEL1 |
| 0 | 9 | 0 *9 + 9 * 8 = 72 | 9 * DEL1 |
| 1 | 9 | 1 *9 + 9 * 8 = 73 | 1 * DEL2 + 8 * DEL1 |

As can be seen, the delay error variation as A is increased, but does not overflow, is +DEL2−DEL1. However, when A overflows, the delay error is changed by −7*DEL2+8*DEL1, which presents a non-linearity.

Figure 2:
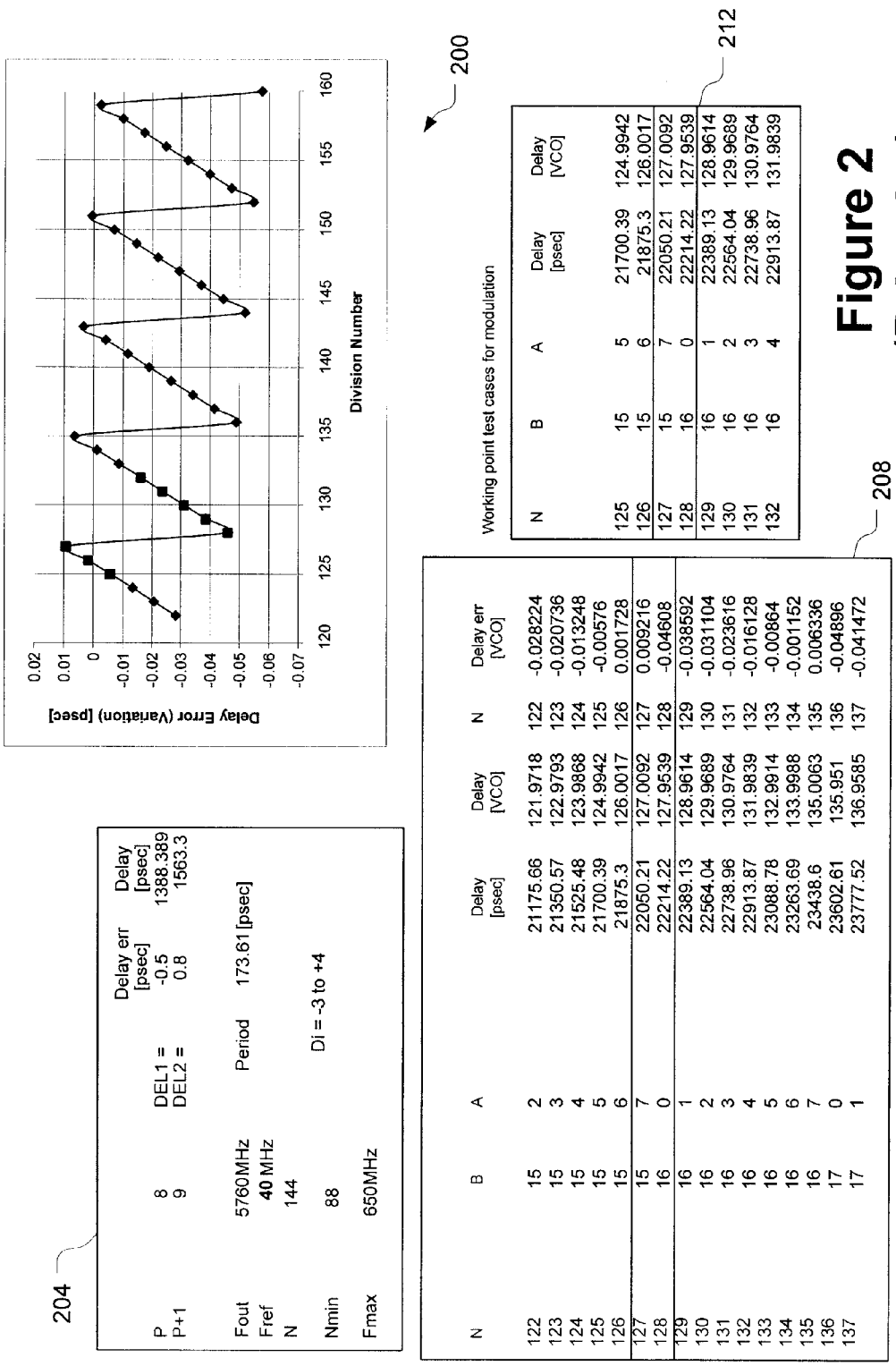
FIG. 2 illustrates a graph and associated data for operation of a prior art synthesizer.

Now referring to FIG. 2, there is illustrated a graph 200 and associated data that corresponds to operations of a prior art synthesizer. The prior art synthesizer may include a P/P+1 DMP-based divider modulated by a MASH I-I-I DSM and having operating parameters as shown in block 204. Operating characteristics, e.g., division numbers N, B values, A values, delays, and delay errors, are shown in block 208. Graph 200 graphically depicts delay error as a function of division numbers. As can be seen, as the values of N are swept, the resulting delay error appears as a saw-tooth function.

Referring also to a modulation-cycle data range shown in block 212, at the point in which an A counter overflows/underflows, between N=127 and N=128, the variation of the delay error becomes non-linear. As used herein, the A counter (or simply "A") may overflow when N is changed to a value that is implemented, at least in part, by incrementing B. Conversely, A may underflow when N is changed to a value that is implemented, at least in part, by decrementing B. For example, if a set operating point were selected as 128 an associated B value would be sixteen and an A value would be zero. A would then underflow when a DSM modulating this set operating point generates a modulated division number such as 127, which is implemented by decrementing B to fifteen and setting A to seven. This may result in a non-linear delay error that would cause undesired noise degradation as discussed above.

Accordingly, embodiments of this disclosure extend operation of the MMP 124 to avoid an overflow/underflow of an A counter that may otherwise result from modulations by the DSM 132. Extending operation of the MMP 124 may be accomplished, at least in part, by the offset controller 130 adding an offset value to A and adding one or more bits to the A counter to prevent A from underflowing/overflowing during DSM modulation. This offset value may be equal to an absolute value of a most negative number of the range of numbers provided by the DSM 132. For example, if the DSM 132 is a MASH I-I-I DSM, as discussed above, it may modulate with a range of numbers between negative three and positive four. In this instance, the offset may be positive three. Such an offset may provide that A, with offset, plus the most negative modulation number is zero and would not underflow by the DSM modulation.

In order to accommodate the offset, one or more additional bits may be added to the A counter of the A/B counters 128. For example, a prior art synthesizer with an 8/9 DMP will have an A counter with three bits for up to seven values to accommodate the range of A values expressed above with relation to Equation 1. If the offset controller 130 adds an offset of three to A, the new range of instantaneous A values may span from zero (e.g., the offset plus the most negative modulation number) to fourteen (e.g., the seven values of A, plus the offset, plus the largest modulation number). A four-bit A counter may be sufficient to accommodate this range of values.

In some embodiments, the offset controller 130 may compensate for the addition of the constant offset by, e.g., subtracting the offset from the modulated division number N. For example, the division number N may be subtracted by three so that when the offset of three is added to the A counter, the synthesizer 100 still locks to the target division value N.

The offset controller 130 may be implemented as a hardware, a software, and/or a firmware element. In some embodiments, the offset controller 130 may be a logic state machine including any combination of elements such as, but not limited to, a programmable logic device, a programmable logic controller, logic gates, flip-flops, relays, registers, etc. In some embodiments, the implementation of the offset controller 130 may not be associated with additional power consumption as is the case with prior art attempts.

The synthesizer 100 may be implemented in many ways. In some embodiments, it may be implemented in integrated circuits as part of electronic systems. In some embodiments, design descriptions of the various embodiments of the present disclosure may be included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present disclosure can also be represented as a hard macro targeted to a specific manufacturing process.

Figure 3:
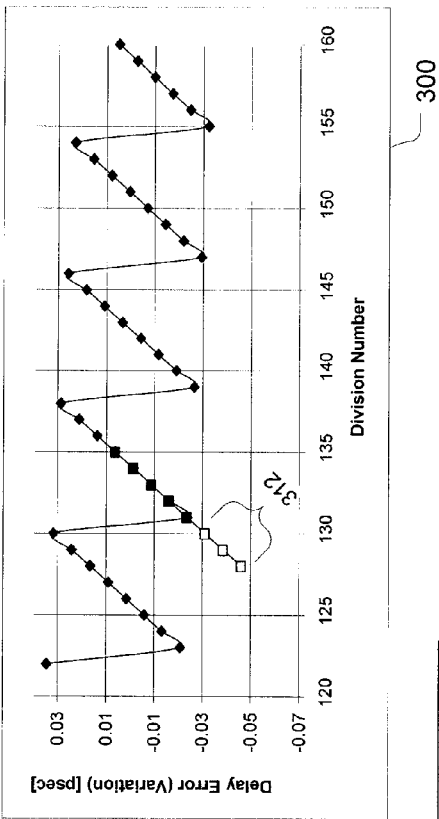
FIG. 3 illustrates a graph and associated data for operation of a synthesizer in accordance with various embodiments.

FIG. 3 illustrates a graph 300 and associated data that corresponds to operations of the synthesizer 100 in accordance with various embodiments. In this embodiment, the divider 120 may be a P/P+1 DMP-based divider, the DSM 132 may be a MASH I-I-I DSM, and the synthesizer 100 may have operating parameters as shown in block 304. As shown in block 304, an offset of three may be added to prevent A from underflowing. Operating characteristics, e.g., N values, B values, A with offset values, delays, and delay errors, may be shown in block 308. Graph 300 graphically depicts delay error as a function of division numbers for the operating characteristics of block 308. Graph 300 also graphically depicts a lower-bound offset extension 312.

In this embodiment, implementation of the division number N may be accomplished by:

$$N = B*P + (A + \text{offset});\quad\quad\quad\quad\quad\quad\text{Equation 4}$$

Thus, the offsets provided by embodiments of the present disclosure allow for the provision of all of the possible modulated division numbers of a complete modulation cycle by holding B constant and only changing A. This may be done for any set operating point of the division number along a range of at least two consecutive division numbers. In some embodiments, the range of consecutive division numbers may include P division numbers. See, e.g, division numbers 131-138 of FIG. 3. Prior art synthesizers, on the other hand, may only be able to provide for all of the possible modulated division numbers of a complete modulation cycle, without changing B, for only a subset of all the possible set operating points of the division number within a given B-value set, e.g., division number 131 of FIG. 2.

Consider, for example, a modulation-cycle data range shown in block 316. In an embodiment, a set operating point of 131 may be selected. In this embodiment, the offset of three may extend the range of A to a sufficient degree such that even the lowest possible division number of the modulation cycle, e.g., 128, may be implemented without A underflowing. This may be exhibited by the lower-bound offset extension 312 extending a linearity of a section of the graph 300 in order to accommodate, what would otherwise be, an underflow without having to decrement B.

Figure 4:
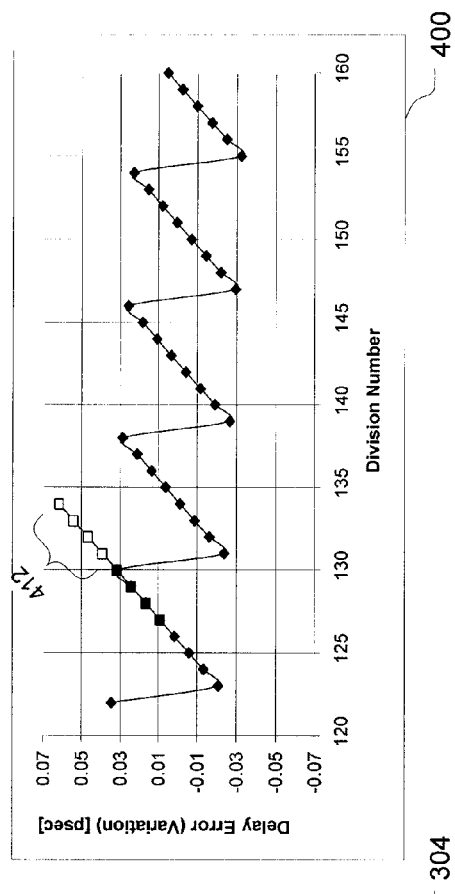
FIG. 4 illustrates a graph and associated data for another operation of a synthesizer in accordance with various embodiments.

FIG. 4 illustrates a graph 400 and associated data that corresponds to operations of the synthesizer 100 in accordance with various embodiments. In this embodiment, the synthesizer 100 may have the same operating parameters, shown in block 304, and the same operating characteristics, shown in block 308, as presented in conjunction with the previously discussed embodiment. Graph 400, similar to graph 300, graphically depicts delay error as a function of division numbers for the operating characteristics of block 308. However, unlike graph 300, graph 400 graphically depicts an upper-bound offset extension 412.

Consider, for example, a modulation-cycle data range shown in block 416. In an embodiment, a set operating point of 130 may be selected. In this embodiment, the offset may extend the range of A to a sufficient degree such that even the highest possible division number of the modulation cycle, e.g., 134, may be implemented without A overflowing. This may be exhibited by the upper-bound offset extension 412 extending a linearity of a section of the graph 400 in order to accommodate, what would otherwise be, an overflow without having to increment B. This may also be exhibited by the A with offset values shown in block 416 being equal to or greater than the P modulus for modulation numbers 128-134. Having the A counter value being greater than or equal to the P modulus is unavailable in prior art P/P+1 DMPs due to the constraints given above with relation to Equation 1.

Thus, the offsets provided by embodiments of the present disclosure allow for the provision of all of the possible modulated division numbers of a complete modulation cycle by holding B constant and only changing A. This may be done for any set operating point of the division number along a range of at least two consecutive division numbers. In some embodiments, the range of consecutive division numbers may include P division numbers. See, e.g, division numbers 131-138 of FIG. 3. Prior art synthesizers, on the other hand, may only be able to provide for all of the possible modulated division numbers of a complete modulation cycle, without changing B, for only a subset of all the possible set operating points of the division number within a given B-value set, e.g., division number 139 of FIG. 2.

Figure 5:
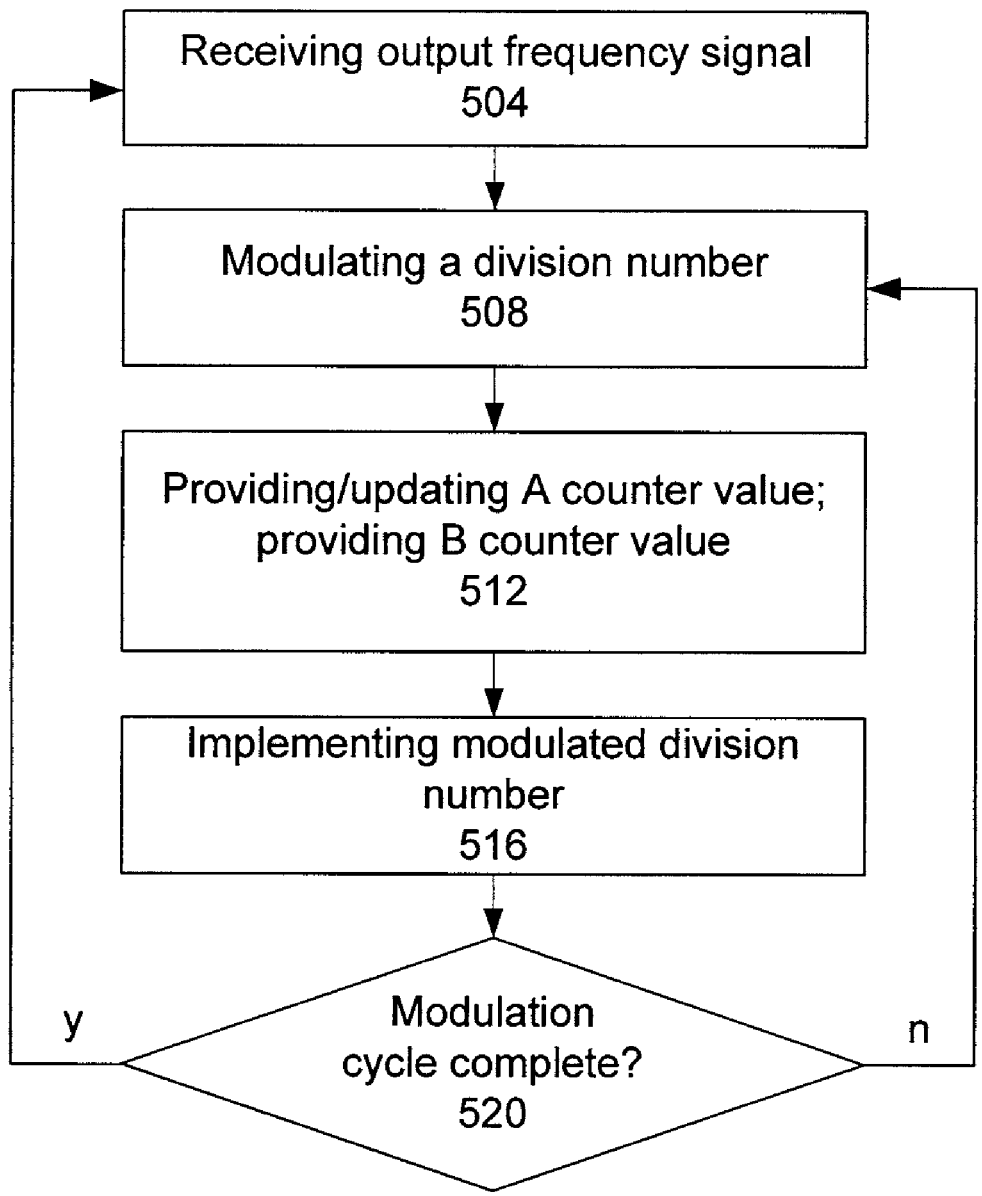
FIG. 5 is a flowchart depicting an operation of a synthesizer in accordance with various embodiments.

FIG. 5 is a flowchart depicting an operation of the synthesizer 100 in accordance with various embodiments. At block 504, a feedback loop of the synthesizer 100 may receive the output frequency signal Fout.

At block 508, a division number may be modulated to provide a modulated division number. As described above, the modulation of the division number may be accomplished by the DSM 132 adding a modulation number to a set operating point.

At block 512, first and second counter values may be provided. In some embodiments, the offset controller 130 may receive the modulated division number from the DSM 132 and control the A/B counters 128 to provide the first and second counter values.

At block 516, the modulated division number may be implemented based at least in part on the values of the A/B counters 128. For example, the MMP 124 may divide the output frequency signal by P for a first number of times and by P+1 for a second number of times. The first and second number of times may be based at least in part on the A and B counter values of the A/B counters 128.

At block 520, the feedback loop may determine whether the modulation cycle is complete. The modulation cycle may be complete when the entire output sequence of modulated division numbers that would obtain the desired fractional-N divider have been implemented. If there are additional modulated division numbers in the output sequence, the operation may loop back to block 508 and the division number may be modulated again to provide the next modulated division number of the output sequence. At block 512, the A counter value may then be updated to allow the next modulated division number to be implemented at block 516. It may be noted that the B counter value may not need to be updated at block 512 as the A offset may be sufficient to allow all of the possible modulated division numbers of a particular modulation cycle to be implemented by only changing the A counter value.

If, at block 520, the feedback loop determines that the modulation cycle is complete, e.g., all of the modulated division numbers of an output sequence have been implemented, the operation may loop back to block 504.

Figure 6:
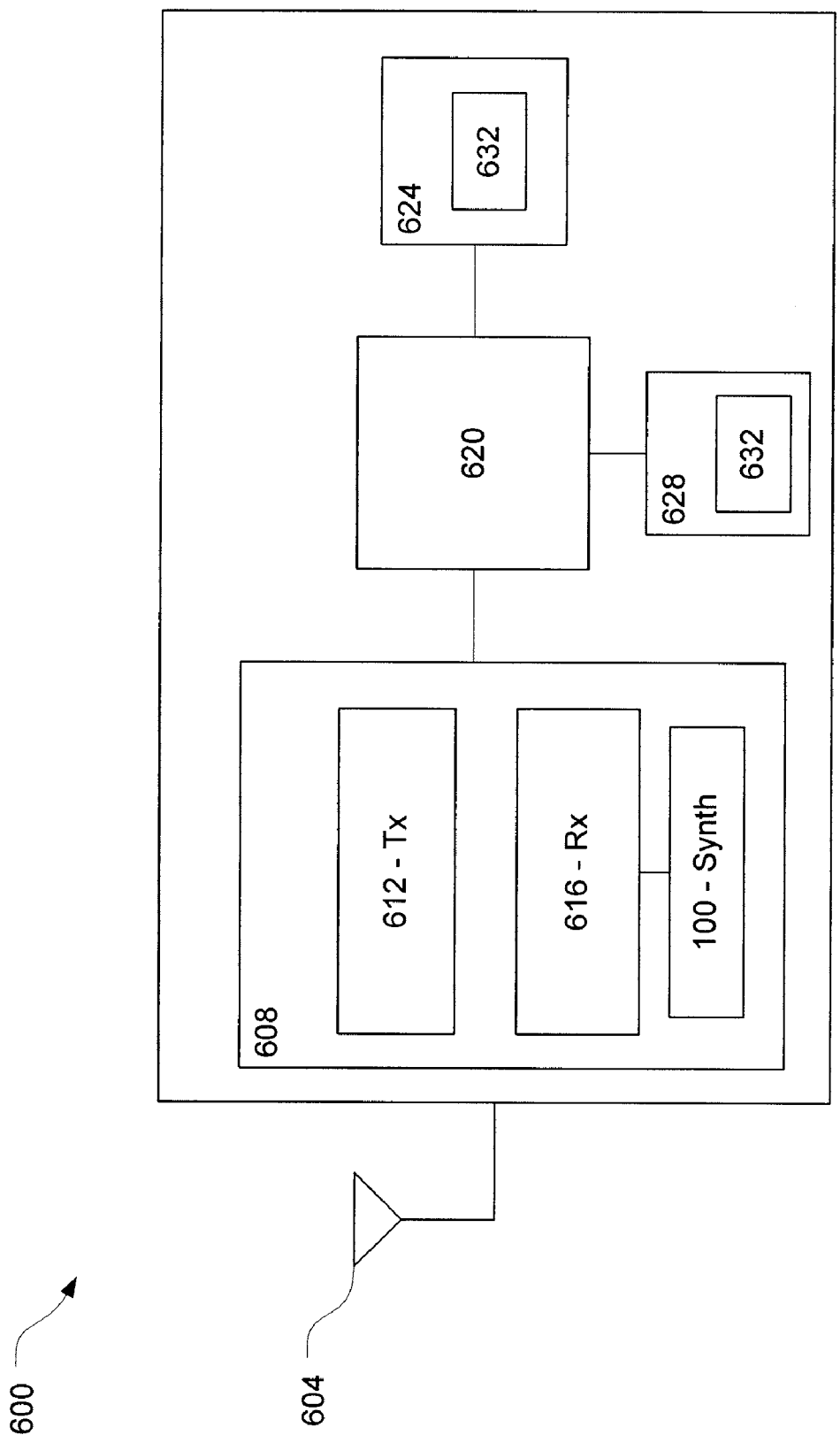
FIG. 6 is a platform utilizing a synthesizer in accordance with various embodiments.

FIG. 6 illustrates a platform 600 employing the synthesizer 100 in accordance with various embodiments. The platform

600 may include an antenna structure 604 and an RF transceiver 608 having a transmitter 612, a receiver 616, and the synthesizer 100 as shown.

The synthesizer 100 may provide the output frequency signal to the receiver 616 as a local oscillator (LO) signal. The receiver 616 may also receive an RF signal via the antenna structure 604. The receiver 616 may downconvert the RF signal to baseband based at least in part on the output frequency signal received from the synthesizer 100.

The antenna structure 604 may include one or more directional antennas, which radiate or receive primarily in one direction (e.g., for 120 degrees), cooperatively coupled to one another to provide substantially omnidirectional coverage. In other embodiments, the antenna structure 604 may include one or more omnidirectional antennas that radiate or receive equally well in all directions.

The transceiver 608 may communicate via the antenna structure 604 in any of a variety of communication protocols/standards. The communication protocols/standards may be selected from any of the Institute of Electrical and Electronics Engineers (IEEE) wireless standards (e.g., 802.11, 802.16, etc.), ultra-wide band (UWB), WCDMA, Bluetooth, etc.

The platform may also have a processor 620, storage 624, and memory 628 coupled to each other as shown. In some embodiments, one or more of these elements may be coupled to each other through one or more buses (not shown).

Memory 628 and storage 624 may include in particular, temporal and persistent copies of offset logic 632, respectively. The offset logic 632 may include instructions that when executed by the processor 620 result in the platform 600 and, in particular, the synthesizer 100 extending operation of the MMP 124 by providing and compensating for, an A offset as described herein.

In various embodiments, the processor 620 may include one or more single-core processors, multiple-core processors, controllers, application-specific integrated circuits (ASICs), etc.

In various embodiments, the memory 628 may include RAM, dynamic RAM (DRAM), static RAM (SRAM), synchronous DRAM (SDRAM), dual-data rate RAM (DDRRAM), etc.

In various embodiments, storage 624 may include integrated and/or peripheral storage devices, such as, but not limited to, disks and associated drives (e.g., magnetic, optical), universal serial bus (USB) storage devices and associated ports, flash memory, read-only memory (ROM), non-volatile semiconductor devices, etc.

In various embodiments, storage 624 may be a storage resource physically part of the platform 600 or it may be accessible by, but not necessarily a part of, the platform 600. For example, the storage 624 may be accessed over a network.

In various embodiments, the platform 600 may have more or less elements, and/or different architectures. In various embodiments, the platform 600 may be any type of wireless communication device including mobile network client devices such as, but not limited to, a personal computing device, a laptop computing device, a phone, etc., or network infrastructure devices, e.g., a base station, an access point, etc.

Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:

1. An apparatus comprising:
    a modulator to select a number from a cyclic output sequence including a range of numbers that includes at least one negative number, and to set a first modulated division number that is the sum of the selected number and a set operating point; and
    a divider including a first counter to provide a first value, a second counter to provide a second value, an offset controller to include, within the first value, an offset that is equal to an absolute value of a most negative number of the range of numbers and a multi-modulus prescaler (MMP) coupled to the first and second counters and the modulator to implement a second modulated division number based at least in part on the first and second values;
    wherein the offset controller subtracts the offset from the second modulated division number to provide the first modulated division number.

2. The apparatus of claim 1, wherein the modulator comprises a delta sigma modulator (DSM).

3. The apparatus of claim 2, wherein the DSM comprises a third-order MASH modulator and the range of numbers is a range between negative three and positive four.

4. The apparatus of claim 1, wherein the MMP comprises a dual-modulus prescaler having a first modulus and a second modulus, the second modulus being one greater than the first modulus.

5. The apparatus of claim 4, wherein the first counter is configured to accommodate a number of values that is greater than the first modulus.

6. The apparatus of claim 1, wherein the modulator is configured to select a plurality of numbers from the range of numbers and to add the plurality of numbers to the set operating point to set a plurality of first modulated division numbers of a modulation cycle.

7. The apparatus of claim 6, wherein the divider is configured to implement a plurality of second modulated division numbers of the modulation cycle by changing the value of the first counter while holding the value of the second counter constant;
    wherein the offset controller is configured to provide the plurality of first modulated division numbers based on implementation of the plurality of second modulated division numbers.

8. The apparatus of claim 1, wherein the apparatus comprises a synthesizer including a feedback loop having the divider and the modulator.

9. The apparatus of claim 1, wherein the first and second counters are complementary metal oxide semiconductor (CMOS) counters.

10. The apparatus of claim 1, wherein the set operating point is a division number selected from a range of at least two consecutive division numbers.

11. The apparatus of claim 10, wherein the range of at least two consecutive division numbers includes a number of division numbers that equals the first modulus.

12. A method comprising:
    adding a plurality of numbers selected from a range of numbers that includes at least one negative number to a set operating point to provide a plurality of first modulated division numbers over a modulation cycle;
    providing first and second counter values for each of the plurality of first modulated division numbers, the first counter value having an offset that is equal to an absolute value of a most negative number of the at least one negative number;

implementing a plurality of second modulated division numbers based corresponding to each of the plurality of first modulated division numbers and based at least in part on the first and second counter values; and subtracting the offset from each of the second modulated division numbers to provide the first modulated division numbers.

13. The method of claim 12, wherein said implementing each of the plurality of second modulated division numbers comprises:

dividing an output frequency by a first modulus for a first number of times and by a second modulus for a second number of times, the first number and the second number based at least in part on the first and second values for each of the plurality of second modulated division numbers.

14. The method of claim 13, wherein the second modulus is one greater than the first modulus and said providing of the first counter value comprises providing the first counter value with a first counter that is configured to accommodate a number of values that is greater than the first modulus.

15. The method of claim 12, wherein the second counter value is held constant for each of the second modulated division numbers and the first counter value changing for at least some of the second modulated division numbers.

16. An apparatus comprising:

a synthesizer to generate an output frequency signal, the synthesizer having a feedback loop with a delta-sigma modulator configured to add a plurality of numbers to a set operating point to provide a plurality of first modulated division numbers of a cycle;

a divider, coupled to the delta-sigma modulator, including a multi-modulus prescaler (MMP) configured to implement a plurality of second modulated division numbers by dividing the output frequency signal by a first modulus and by a second modulus based at least in part on a first counter value and a second counter value, the divider further including an offset controller configured to provide an offset to the first counter value to enable implementation of each of the plurality of second modulated division number of the cycle without changing the second counter and to apply a compensating offset to each of the plurality of second modulated division numbers of the cycle to obtain the plurality of first modulated division numbers; and a receiver coupled to the synthesizer and configured to generate a baseband signal based at least in part on a radio frequency (RF) signal and the output frequency signal.

17. The apparatus of claim 16, wherein the second modulus is one greater than the first modulus and the first counter value is greater than or equal to the first modulus and less than or equal to the second counter value.

18. The apparatus of claim 16, wherein the delta sigma modulator comprises a third-order MASH modulator and the range of numbers is a range between negative three and positive four.

19. The apparatus of claim 16, wherein the delta-sigma modulator is further configured to select a plurality of modulation values from a range of modulation values, and wherein the offset is equal to an absolute value of a most negative value of the range of modulation values.

20. A method comprising:

generating an output frequency signal based at least in part on a reference signal and a feedback signal;

adding, with a digital signal modulator, a plurality of numbers to a set operating point to provide a plurality of first modulated division numbers of a cycle;

implementing a plurality of second modulated numbers corresponding to each of the plurality of first modulated division numbers by controlling a first counter and a second counter; and providing, with an offset controller, an offset to the first counter to enable implementation of each of the plurality of second modulated division numbers of the cycle without changing the second counter; and providing, with the offset controller, a compensating offset to each of the plurality of second modulated division numbers of the cycle to obtain the plurality of first modulated numbers.

21. The method of claim 20, wherein said adding includes selecting a plurality of modulation values from a range of modulation values; and said providing the offset comprises providing an offset such that all possible second modulated division numbers, based on the set operating point and the range of modulation values, can be implemented without changing the second counter.

22. The method of claim 20, wherein said providing the offset comprises providing an offset such that all possible second modulated division numbers based on the set operating point, and the range of modulation values, can be implemented without changing the second counter.

23. The method of claim 20, wherein said adding includes selecting a plurality of modulation values from a range of modulation values, and wherein the offset is equal to an absolute value of a most negative value of the range of modulation values.

* * * * *